(12) United States Patent
Jin et al.

(10) Patent No.: US 8,804,062 B2
(45) Date of Patent: Aug. 12, 2014

(54) THIN FILM TRANSISTOR SUBSTRATE, DISPLAY APPARATUS UTILIZING SAME, AND RELATED MANUFACTURING METHODS

(71) Applicant: Samsung Display Co., Ltd., Yongin (KR)

(72) Inventors: Guang-Hai Jin, Yongin (KR); Jae-Beom Choi, Yongin (KR); Kwan-Wook Jung, Yongin (KR); June-Woo Lee, Yongin (KR); Sung-Soo Choi, Yongin (KR); Seong-Jun Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 110 days.

(21) Appl. No.: 13/649,982

(22) Filed: Oct. 11, 2012

(65) Prior Publication Data

US 2013/0300966 A1 Nov. 14, 2013

(30) Foreign Application Priority Data

May 8, 2012 (KR) .................. 10-2012-0048826

(51) Int. Cl.
*G02F 1/136* (2006.01)
*G02F 1/1343* (2006.01)

(52) U.S. Cl.
USPC .......................................... 349/43; 349/139

(58) Field of Classification Search
CPC .......... G02F 1/13628; G02F 1/136213; G02F 1/1368; G02F 1/1343; G02F 1/1333; G02F 1/134309; G02F 1/134336; G02F 1/1362; G02F 1/136; G02F 1/136227; G02F 1/133345; G02F 1/13439; G02F 1/1345; G02F 1/136277; G02F 2001/136295; G02F 2001/13629; G02F 2201/123; G02F 2201/02; G09G 3/3648; G09G 2300/0426; H01L 27/1214; H01L 27/124; H01L 27/3248; H01L 27/326; H01L 27/3276; H01L 29/41733; H01L 29/786; H01L 29/4958; H01L 33/08; H01L 23/535; H01L 21/28008; H01L 2251/568; H01L 2924/12044
USPC ........... 349/43, 46, 139, 143, 42, 38, 39, 140, 349/144, 69; 257/88, E33.062, 71, 72, 257/E29.273; 345/87, 92, 55, 76; 438/30, 438/151
See application file for complete search history.

(56) References Cited

U.S. PATENT DOCUMENTS 7,233,379 B2 * 6/2007 Kim et al. ..................... 349/139
7,741,641 B2 6/2010 Bae et al.
(Continued)

FOREIGN PATENT DOCUMENTS

JP 2005-316467 11/2005
KR 10-2008-0049446 6/2008
(Continued)

*Primary Examiner* — Thoi Duong
(74) *Attorney, Agent, or Firm* — Robert E. Bushnell, Esq.

(57) ABSTRACT

A thin film transistor and a display apparatus include: a substrate; a plurality of first conductive lines formed on the substrate, each including a main body and a curved portion connected to the main body; a plurality of second conductive lines crossing the curved portions of the first conductive lines; and a plurality of pixel electrodes formed adjacent to the first conductive lines. The plurality of pixel electrodes includes a first pixel electrode disposed toward a side of one first conductive line, and a second pixel electrode disposed toward the other side of the one first conductive line. The display apparatus also includes an intermediate layer connected to the pixel electrodes for displaying images and an opposite electrode formed thereon.

41 Claims, 4 Drawing Sheets

(56) References Cited

U.S. PATENT DOCUMENTS

| | | |
|---|---|---|
| 8,107,029 B2 | 1/2012 | Peng et al. |
| 2005/0012699 A1* | 1/2005 | Lee et al. .................. 345/87 |
| 2005/0231447 A1 | 10/2005 | Hu et al. |
| 2005/0258486 A1 | 11/2005 | Yoon |
| 2006/0001638 A1 | 1/2006 | Jeon et al. |
| 2006/0001792 A1 | 1/2006 | Choi |
| 2006/0086979 A1 | 4/2006 | Kim et al. |
| 2006/0205125 A1 | 9/2006 | Bae et al. |
| 2006/0267002 A1 | 11/2006 | Fischer et al. |
| 2008/0268581 A1 | 10/2008 | Chin et al. |
| 2011/0204370 A1 | 8/2011 | Yoon et al. |

FOREIGN PATENT DOCUMENTS

| | | |
|---|---|---|
| KR | 10-2008-0056944 | 6/2008 |
| KR | 10-0928491 | 11/2009 |

\* cited by examiner

THIN FILM TRANSISTOR SUBSTRATE, DISPLAY APPARATUS UTILIZING SAME, AND RELATED MANUFACTURING METHODS

CLAIM OF PRIORITY

This application makes reference to, incorporates the same herein, and claims all benefits accruing under 35 U.S.C. §119 from an application earlier filed in the Korean Intellectual Property Office on the 8$^{th}$ of May 2012 and there duly assigned Serial No. 10-2012-0048826.

BACKGROUND OF THE INVENTION

1. Field of the Invention

The present invention relates to a thin film transistor substrate and a display apparatus using same, and related manufacturing methods, and more particularly, to a thin film transistor substrate capable of improving electrical characteristics and image quality characteristics, and a display apparatus using same, and related manufacturing methods.

2. Description of the Related Art

Display apparatuses are apparatuses for displaying images that may be recognized by a user. The display apparatuses may include a thin film transistor substrate for displaying various information easily.

A thin film transistor substrate includes a plurality of conductive lines. For example, the thin film transistor substrate includes scan lines and data lines. The scan lines apply scan signals to pixels disposed in the display apparatus, and the data lines apply data signals to the pixels, respectively.

The scan line and the data line are not formed in the same layer. That is, one or more insulating layers are disposed between the scan line and the data line. Here, the scan line and the data line may contact each other unintentionally during fabricating the display apparatus, thereby generating a short circuit defect. In particular, the short circuit defect may occur in a region where the scan line and the data line overlap each other.

The short circuit defect between the scan line and the data line degrades image quality characteristics, and thus, a repairing process is performed by using a laser cutting method.

Meanwhile, particles or other by-products generated during the repairing process affect pixel electrodes, and thus other defects may occur, and there may be a limitation in improving the electrical characteristics and the image quality characteristics of the display apparatus.

SUMMARY OF THE INVENTION

The present invention provides a thin film transistor substrate capable of improving electrical characteristics and image quality characteristics, a display apparatus using the same, and related manufacturing methods.

According to an aspect of the present invention, there is provided a thin film transistor substrate including: a substrate; a plurality of first conductive lines formed on the substrate, each comprising a main body extending in a direction and a curved portion connected to the main body; a plurality of second conductive lines disposed to cross the curved portions of the first conductive lines; and a plurality of pixel electrodes formed adjacent to the first conductive lines; wherein the plurality of pixel electrodes include a first pixel electrode that is disposed toward a side of one first conductive line among the plurality of first conductive lines, and a second pixel electrode disposed toward the other side of the one first conductive line; wherein a distance between the one first conductive line and the first pixel electrode is greater than a distance between the one first conductive line and the second pixel electrode; and wherein the curved portion includes an overlapping portion overlapping with the second conductive line and the overlapping portion is closer to the first pixel electrode than an extending line of the main body is.

According to another aspect of the present invention, there is provided a display apparatus including: a substrate; a plurality of first conductive lines formed on the substrate, each comprising a main body extending in a direction and a curved portion connected to the main body; a plurality of second conductive lines arranged to cross the curved portions of the first conductive lines; a plurality of pixel electrodes formed adjacent to the first conductive lines; an intermediate layer electrically connected to the pixel electrodes for displaying images; and an opposite electrode formed on the intermediate layer; wherein the plurality of pixel electrodes include a first pixel electrode that is disposed toward a side of one first conductive line among the plurality of first conductive lines, and a second pixel electrode disposed toward the other side of the one first conductive line; wherein a distance between the one first conductive line and the first pixel electrode is greater than a distance between the one first conductive line and the second pixel electrode; and wherein the curved portion includes an overlapping portion overlapping with the second conductive line, and the overlapping portion is closer to the first pixel electrode than an extending line of the main body is.

The curved portion of the first conductive line may protrude toward the first pixel electrode.

The curved portion of the first conductive line may include a protrusion portion and connecting portions, wherein the protrusion portion may include the overlapping portion and the connecting portions are connected to the main body.

The protrusion portion may be formed so as to be parallel with the main body, and the connecting portions may be connected to opposite sides of the protrusion portion.

A separation region which is surrounded by the protrusion portion and the connecting portions, and which is separated from the main body, may be formed.

The separation region may be formed so as to overlap with the second conductive line.

The pixel electrodes may be formed at the same layer as the first conductive lines.

The thin film transistor substrate may further include: an active layer formed on the substrate; a gate electrode formed at the same layer as the first conductive lines; and a source electrode and a drain electrode formed at the same layer as the second conductive lines; wherein one of the source electrode and the drain electrode may be electrically connected to the pixel electrode.

The pixel electrode may include ITO, IZO, ZnO, $In_2O_2$, IGO, or AZO.

The gate electrode may include a first conductive layer and a second conductive layer formed on the first conductive layer, and the pixel electrode may be fanned of the same material as the first conductive layer and on the same layer as the first conductive layer.

The intermediate layer may include an organic emission layer or a liquid crystal layer.

The first conductive lines may be scan lines and the second conductive lines may be data lines.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, structures and operations of the present invention will be described in detail with reference to accompanying drawings. Expressions such as "at least one of," when preceding a list of elements, modify the entire list of elements and do not modify the individual elements of the list.

Figure 1:
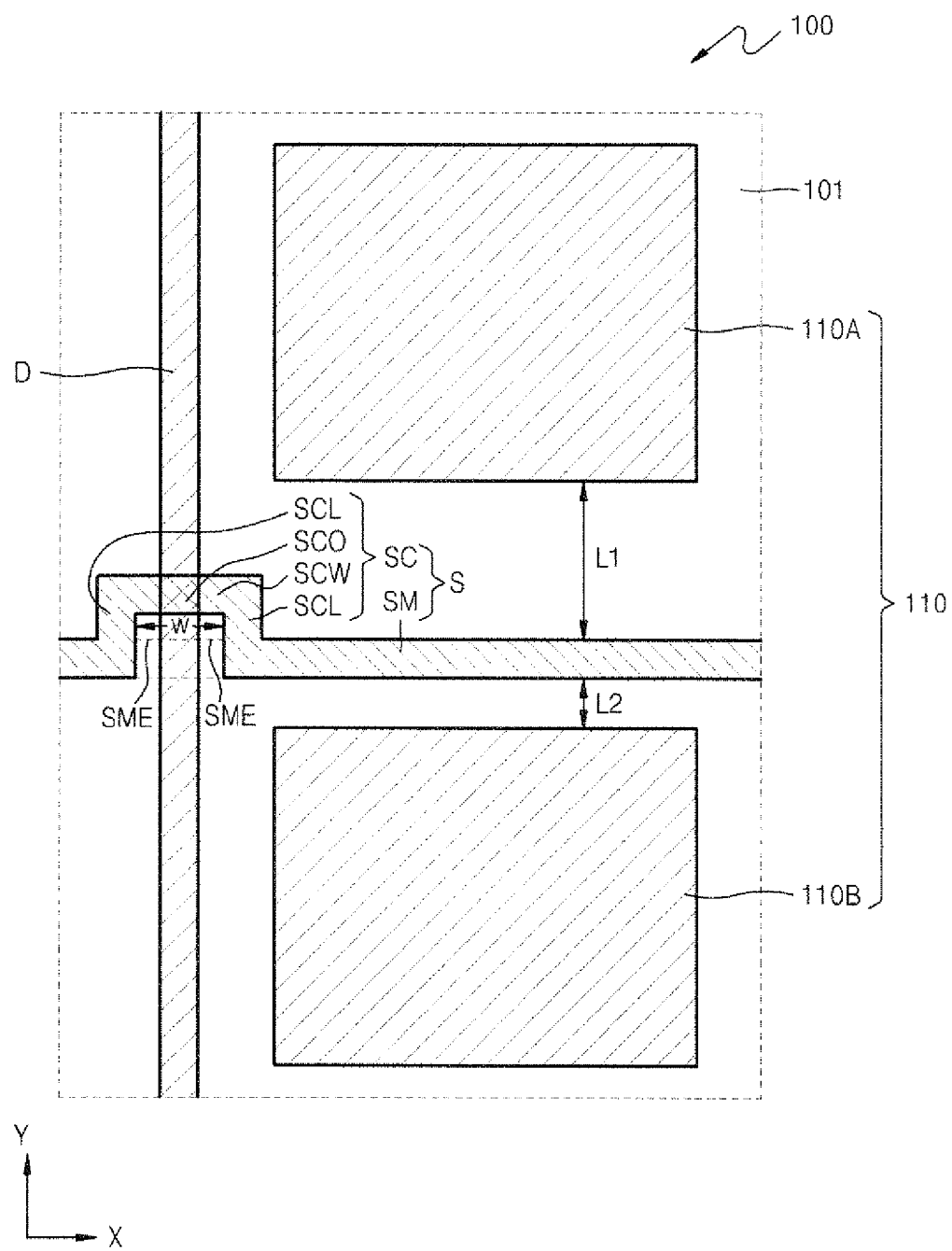
FIG. 1 is schematic plan view of a thin film transistor substrate according to an embodiment of the present invention.

FIG. 1 is a schematic plan view of a thin film transistor substrate according to an embodiment of the present invention.

Referring to FIG. 1, the thin film transistor substrate 100 includes a substrate 101, a scan line S, a data line D, and a pixel electrode 110. FIG. 1 shows only the scan line S, the data line D, and the pixel electrode 110 for convenience of description. An active layer (not shown), a gate electrode (not shown), a source electrode (not shown), and a drain electrode (not shown) will be described later with reference to FIG. 2A.

The scan line S and the data line D are formed in different layers relative to each other. That is, one or more insulating layers (not shown) are disposed between the scan line S and the data line D.

The scan line S is a line through which a scan signal is transmitted, and the data line D is a line through which a data signal is transmitted. The pixel electrode 110 is formed so as to correspond to each of pixels of a display apparatus (not shown) including the thin film transistor substrate 100. In addition, the data line D applies the data signal to each of the pixels, and the scan line S applies the scan signal to each of the pixels.

FIG. 1 shows one scan line S and one data line D for convenience of description; however, the thin film transistor substrate 100 of the present embodiment includes a plurality of scan lines S and a plurality of data lines D.

In FIG. 1, two pixel electrodes 110, that is, a first pixel electrode 110A and a second pixel electrode 110B, are shown for convenience of description. However, the present invention is not limited thereto, that is, the thin film transistor substrate 100 may include three or more pixel electrodes 110.

The data line D extends in a direction (Y-axis direction of FIG. 1).

The scan line S includes a main body SM and a curved portion SC. The main body SM is extended in a direction (X-axis direction of FIG. 1). The main body SM is disposed so as to be adjacent to the two pixel electrodes 110A and 110B. That is, the main body SM is disposed between the first pixel electrode 110A and the second pixel electrode 110B. Distances between the main body SM and the pixel electrodes 110A and 110B are different from each other, and in more detail, a distance L1 between the main body SM and the first pixel electrode 110A is greater than a distance L2 between the main body SM and the second pixel electrode 110B.

Various circuit patterns (not shown) may be formed in spaces between the main body SM of the scan line S and the pixel electrodes 110A and 110B, the circuit patterns (not shown) of different sizes and shapes from each other may be formed in each of regions. Thus, the distance between the main body SM and the first pixel electrode 110A and the distance between the main body SM and the second pixel electrode 110B may be different from each other.

The curved portion SC is connected to the main body SM. The curved portion SC includes a protrusion portion SCW and connecting portions SCL. The connecting portions SCL are connected to the main body SM.

The protrusion portion SCW includes an overlapping region SCO, and the overlapping region SCO overlaps with the data line D.

The overlapping region SCO is close to the first pixel electrode 110A when compared to an extending line SME of the main body SM. Thus, the curved portion SC has a shape protruding toward the first pixel electrode 110A.

The protrusion portion SCW may be parallel with the main body SM. However, embodiments of the present invention are not limited thereto, that is, the protrusion portion SCW may not be parallel with the main body SM or it may be formed so as to have a curved shape.

The connecting portions SCL are connected to opposite sides of the protrusion portions SCW. Here, the connecting portions SCL may be parallel with the data line D. However, embodiments of the present invention are not limited thereto, that is, the connecting portions SCL may not be parallel with the data line D or it may be formed as curves.

The curved portion SC forms a separation region having a predetermined width W. That is, the separation region which is surrounded by the protrusion portion SCW and the connecting portions SCL, and which has the width W overlaps with the data line D.

Figure 2A:
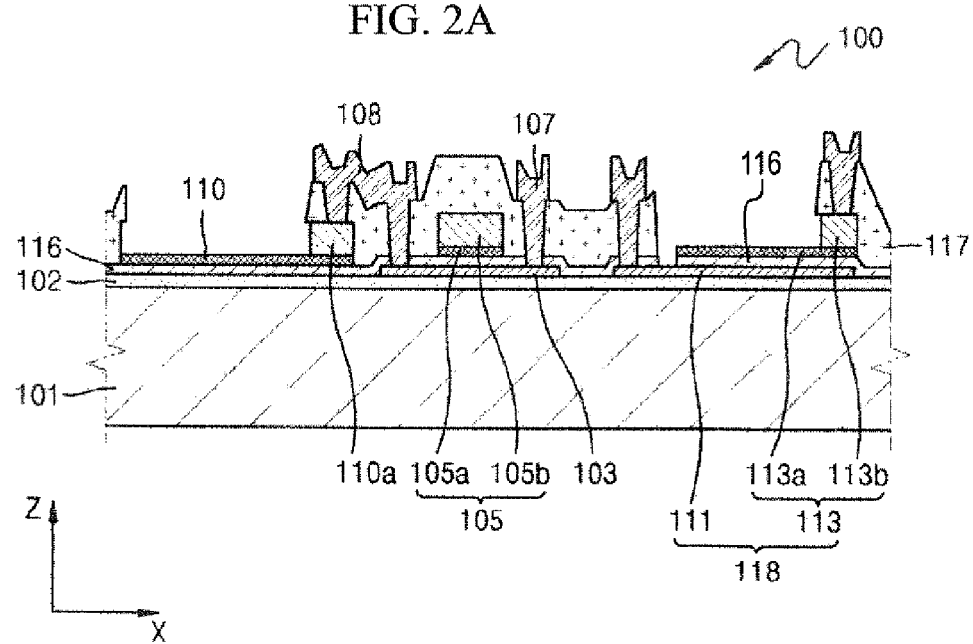
FIG. 2A is a schematic cross-sectional view of the thin film transistor substrate of FIG. 1.
Figure 2B:
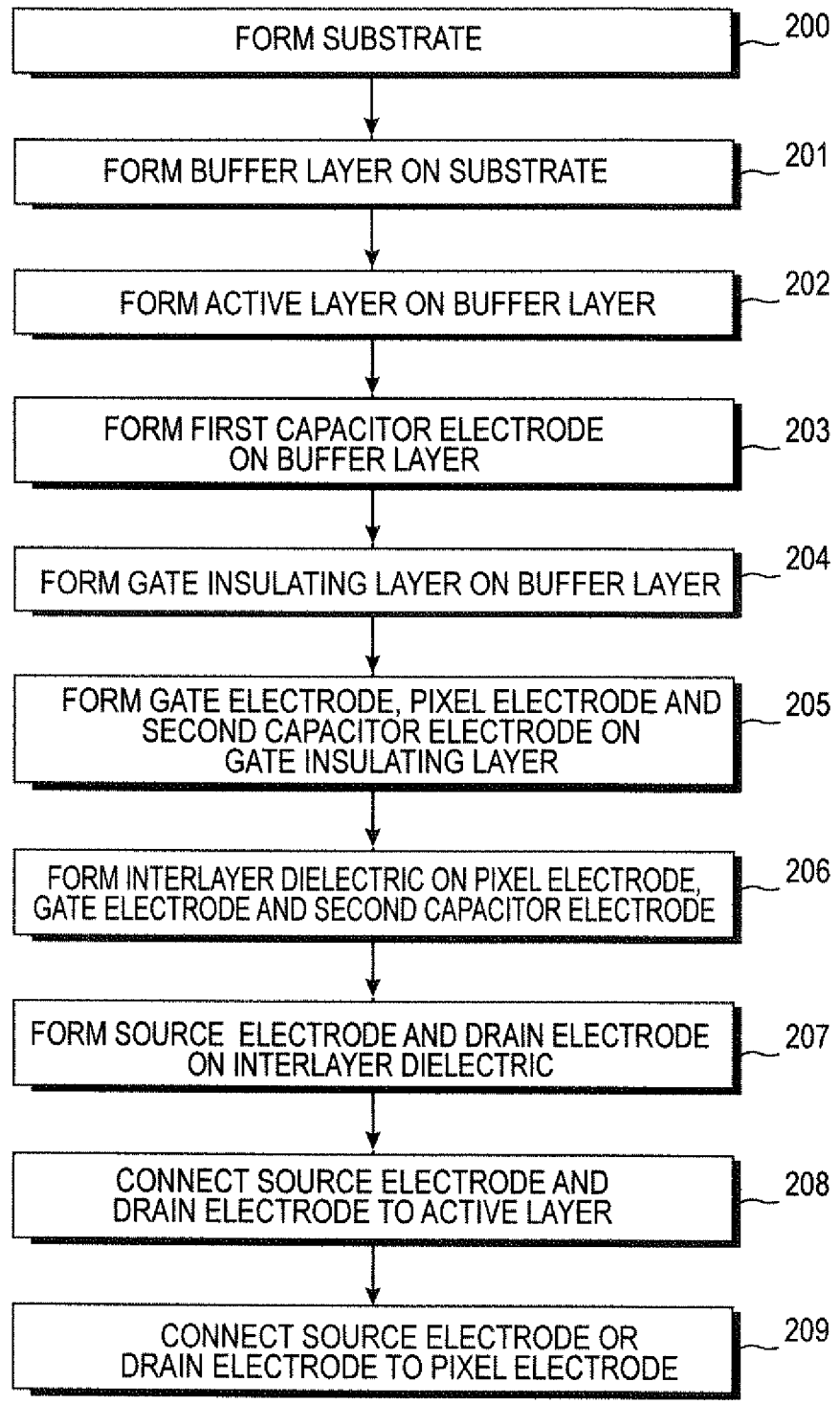
FIG. 2B is a flowchart of the related manufacturing method.

FIG. 2A is a schematic cross-sectional view of the thin film transistor substrate of FIG. 1, and FIG. 2B is a flowchart of the related manufacturing method. That is, FIG. 2A is a cross-sectional view showing a part of the thin film transistor substrate 100 of FIG. 1.

The substrate 101 may be formed of a transparent glass material mainly including $SiO_2$ (FIG. 2B, block 200). However, embodiments of the present invention are not limited thereto, that is, the substrate 101 may be formed of a transparent plastic material. Here, the plastic material for forming the substrate 101 may be one or more selected from various organic materials.

A buffer layer 102 is formed on the substrate 101 (FIG. 2B, block 201). The buffer layer 102 prevents impurities from infiltrating into the substrate 101, provides a flat surface on the substrate 101, and may be formed of various materials. For example, the buffer layer 102 may be formed of an inorganic material such as silicon oxide, silicon nitride, silicon oxynitride, aluminum oxide, aluminum nitride, titanium oxide, or titanium nitride, or an organic material such as polyimide, polyester, or acryl, and may be formed as a stacked structure including a plurality of the above materials. In addition, the buffer layer 102 may not be provided if necessary.

An active layer 103 is formed on the buffer layer 102 (FIG. 2B, block 202). In addition, a first capacitor electrode 111 is formed on the buffer layer 102, and the first capacitor electrode 111 may be formed of the same material as the active layer 103 (FIG. 2B, block 203).

A gate insulating layer 116 is formed on the buffer layer 102 so as to cover the active layer 103 and the first capacitor electrode 111 (FIG. 2B, block 204).

A gate electrode 105, the pixel electrode 110, and a second capacitor electrode 113 are formed on the gate insulating layer 116 (FIG. 2B, block 205).

Here, the gate electrode 105 is formed in the same layer as that of the scan line S of FIG. 1. In addition, the gate electrode 105 is formed of the same material as the scan line S of FIG. 1.

The gate electrode 105 includes a first conductive layer 105a and a second conductive layer 105b. The first conductive layer 105a includes a transmissive conductive material, for example, at least one or more selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The second conductive layer 105b may be formed on the first conductive layer 105a, and may contain metal or an alloy of metal such as Mo, MoW, or Al-based alloy; however, the embodiments of the present invention are not limited thereto.

The pixel electrode 110 includes a transmissive conductive material, and may be formed of the same material as the first conductive layer 105a. A conductive portion 110a is formed on a predetermined region on the pixel electrode 110, and the conductive portion 110a is formed of the same material as the second conductive layer 105b.

In addition, the pixel electrode 110 is formed on the same layer as the gate electrode 105. Also, the pixel electrode 110 is formed on the same layer as the scan line S of FIG. 1.

The second capacitor electrode 113 includes a first layer 113a and a second layer 113b. The first layer 113a is formed of the same material as the first conductive layer 105a, and the second layer 113b is formed of the same material as the second conductive layer 105b. In addition, the second layer 113b may be formed so as to have a dual-layered or a triple-layered structure like the pixel electrode 110.

The second layer 113b is formed on the first layer 113a and is less than the first layer 113a. In addition, the second capacitor electrode 113 may overlap with the first capacitor electrode 111, and may be less than the first capacitor electrode 111.

An interlayer dielectric 117 is formed on the pixel electrode 110, the gate electrode 105, and the second capacitor electrode 113 (FIG. 2B, block 206). The interlayer dielectric 117 may include various insulating materials such as an organic material or an inorganic material. Meanwhile, although not shown in FIG. 2A, the interlayer dielectric 117 may be formed so as to have a multiple-layered structure according to the embodiment of the present invention. For example, the interlayer dielectric 117 may be formed so as to have a stacked structure including two or more layers of an inorganic layer/an organic layer. Thus, insulating and protecting effects of the interlayer dielectric 117 may be increased. Here, the inorganic layer forming the interlayer dielectric 117 may include silicon oxide or silicon nitride.

A source electrode 107 and a drain electrode 108 are formed on the interlayer dielectric 117 (FIG. 2B, block 207). The source electrode 107 and the drain electrode 108 are formed at the same layer as the data line D of FIG. 1, and may be formed of the same material as the data line D.

The source electrode 107 and the drain electrode 108 are connected to the active layer 103 (FIG. 2B, block 208).

In addition, one of the source electrode 107 and the drain electrode 108 is electrically connected to the pixel electrode 110 (FIG. 2B, block 209), and in FIG. 2A, the drain electrode 108 is electrically connected to the pixel electrode 110. In more detail, the drain electrode 108 contacts the conductive portion 110a.

As described above, the data line D and the scan line S of FIG. 1 are formed at different layers from each other. That is, one or more insulating layers are disposed between the data line D and the scan line S. For example, the gate insulating layer 116 and the interlayer dielectric 118 shown in FIG. 2A may be disposed between the data line D and the scan line S.

Thus, the overlapping portion SCO of the scan line S shown in FIG. 1 and the data line D do not contact each other, even when they overlap each other. However, the overlapping portion SCO and the data line D may be connected to each other due to generation of particles and defects in processing conditions during the manufacturing processes. That is, a short circuit may occur between the data line D and the scan line S.

When the short circuit is generated, a repairing process using a laser cutting process may be performed so as to disconnect the overlapping portion SCO and the data line D.

Here, by-products such as particles may affect the electrical characteristics of the first pixel electrode 110A and the second pixel electrode 110B during the laser cutting. In addition, according to the present embodiment, since the pixel electrodes 110 are formed at the same layer as the scan line S, the pixel electrodes 110 may be substantially contaminated due to the by-products of the laser cutting process.

In particular, since the second pixel electrode 110B of the scan line S is closer to the scan line S when compared to the first pixel electrode 110A, the possibility of generating defects in the second pixel electrode 110E may increase.

However, according to the present embodiment, the curved portion SC of the scan line S is formed so that the overlapping portion SCO that overlaps with the data line D may be closer to the first pixel electrode 110A. That is, since the curved portion is formed to be separate from the second pixel electrode 110B, the overlapping portion SCO is closer to the first pixel electrode 110A than the extending line SME of the main body SM is.

Therefore, the distance between the overlapping portion SCO and the first pixel electrode 110A and the distance between the overlapping portion SCO and the second pixel electrode 110B are nearly similar to each other. Thus, reduction of the electrical characteristics of the second pixel electrode 110B due to the by-products generated during the repairing process using the laser cutting may be effectively prevented.

In particular, the curved portion SC of the scan line S includes the protrusion portion SCW and the connecting portions SCL, and the separation region that is surrounded by the protrusion portion SCW and the connecting portions SCL and has a width W is formed.

The separation region ensures a space for easily performing the cutting operation in the laser cutting process. In addition, the width that is laser cut may be reduced.

The scan line S and the data line D are described in the present embodiment, but the present invention is not limited thereto. That is, the present embodiment may be applied to various conductive lines that are adjacent to the pixel electrodes 110 and are arranged to cross each other.

Figure 3A:
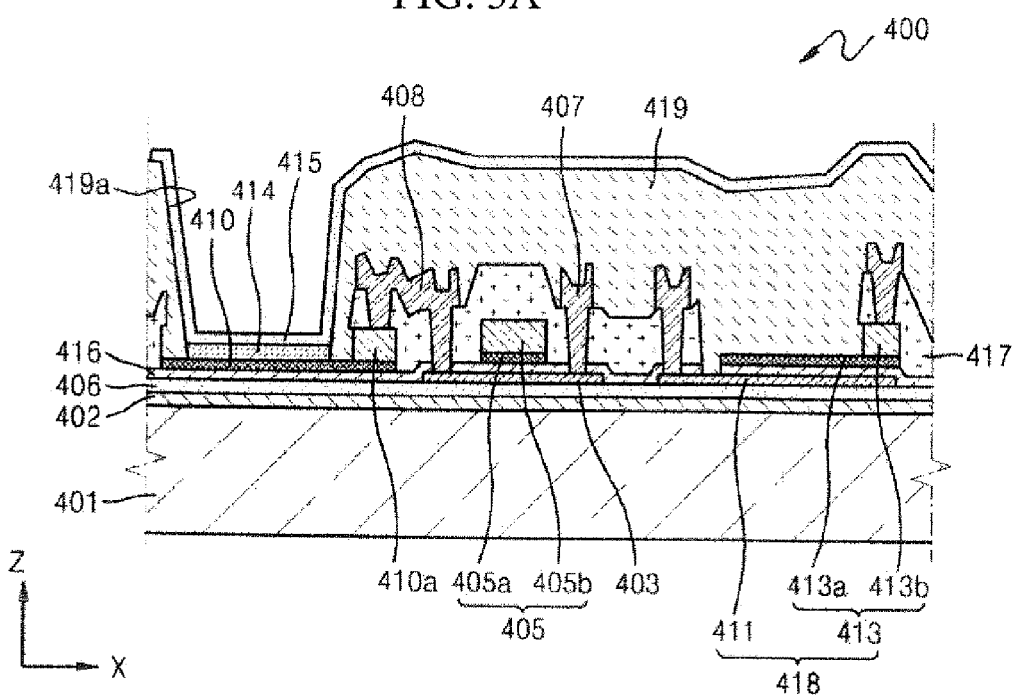
FIG. 3A is a schematic cross-sectional view of a display apparatus according to an embodiment of the present invention.
Figure 3B:
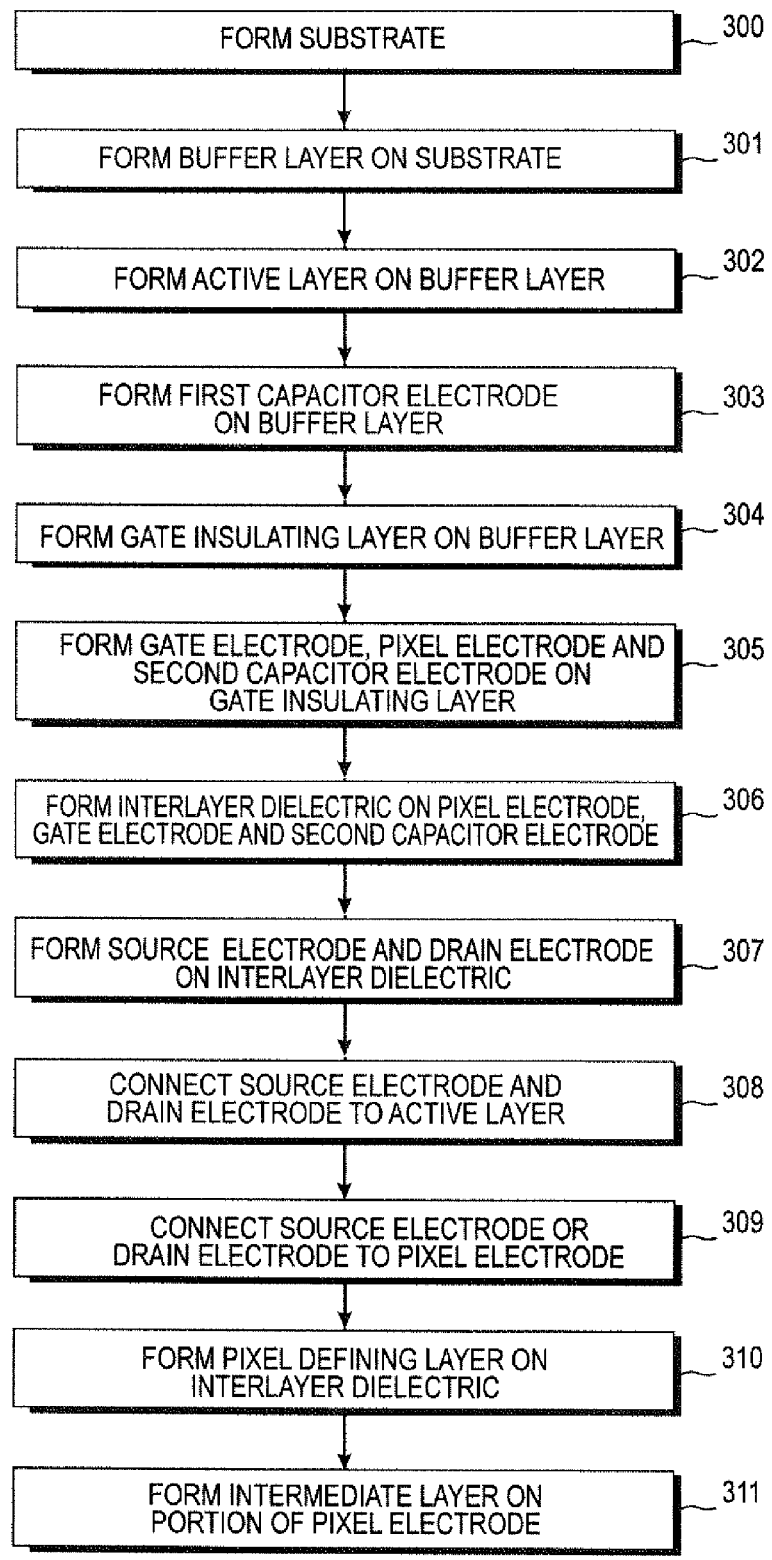
FIG. 3B is a flowchart of the related manufacturing method.

FIG. 3A is a schematic cross-sectional view of a display apparatus according to an embodiment of the present invention, and FIG. 3B is a flowchart of the related manufacturing method. In more detail, the display apparatus 400 of FIG. 3A includes the thin film transistor substrate 100 shown in FIGS.

1 and 2A, and descriptions of the same elements as those of FIGS. 1 and 2A are not provided for convenience of description.

A substrate 401 if formed, and a buffer layer 402 is formed on a substrate 401 (FIG. 313, blocks 300 and 301). An active layer 403 having a predetermined area is formed on the buffer layer 402 (FIG. 3B, block 302). In addition, a first capacitor electrode 411 is farmed on the buffer layer 402 (FIG. 3B, block 303). The first capacitor electrode 411 may be formed of the same material as the active layer 403.

A gate insulating layer 406 is formed on the buffer layer 402 so as to cover the active layer 403 and the first capacitor electrode 411 (FIG. 3B, block 304).

A gate electrode 405, a pixel electrode 410, and a second capacitor electrode 413 are formed on the gate insulating layer 406 (FIG. 3B, block 305).

The gate electrode 405 includes a first conductive layer 405a and a second conductive layer 405b.

The pixel electrode 410 includes a transmissive conductive material, and may be formed of the same material as the first conductive layer 405a. A conductive portion 410a is disposed on a predetermined upper portion of the pixel electrode 410, and the conductive portion 410a is formed of the same material as the second conductive layer 405b.

The second capacitor electrode 413 includes a first layer 413a and a second layer 413b, and the first layer 413a is formed of the same material as the first conductive layer 405a and the second layer 413b is formed of the same material as the second conductive layer 405b. In addition, the second layer 413b may be formed so as to have a double or triple-layered structure like the pixel electrode 410.

The second layer 413b is formed on the first layer 413a so as to be smaller than the first layer 413a. In addition, the second capacitor electrode 413 overlaps with the first capacitor electrode 411, and is smaller than the first capacitor electrode 411.

An interlayer dielectric 417 is formed on the pixel electrode 410, the gate electrode 405, and the second capacitor electrode 413 (FIG. 3B, block 306). A source electrode 407 and a drain electrode 408 are formed on the interlayer dielectric 417 (FIG. 3B, block 307). The source electrode 407 and the drain electrode 408 are connected to the active layer 403 (FIG. 3B, block 308).

In addition, one of the source electrode 407 and the drain electrode 408 is electrically connected to the pixel electrode 410 (FIG. 3B, block 309), and FIG. 3A shows that the drain electrode 408 is electrically connected to the pixel electrode 401. In more detail, the drain electrode 408 contacts the conductive portion 410a.

A pixel defining layer 419 is formed on the interlayer dielectric 417 so as to cover the source electrode 407, the drain electrode 408, and a capacitor 418 (FIG. 3B, block 310).

The pixel defining layer 419 includes a predetermined opening 419a that corresponds to an upper surface of the pixel electrode 410, and an intermediate layer 414 is formed on the portion of pixel electrode 410 that is exposed through the opening 419a of the pixel defining layer 419 (FIG. 3B, block 311).

The intermediate layer 414 may be formed as a low-molecular weight organic layer or a high-molecular weight organic layer. When the intermediate layer 414 is formed as a low-molecular weight organic layer, a single or multi-layer structure including a hole injection layer (HIL), a hole transport layer (HTL), an organic emission layer, an electron transport layer (ETL), and an electron injection layer (EIL) may be formed.

The HIL may be formed of a phthalocyanine compound such as copper phthalocyanine, or TCTA, m-MTDATA, or m-MTDAPB which is a star-bust type amine.

The HTL may be formed of N,N'-bis(3-methylphenyl)-N, N'-diphenyl-[1,1-biphenyl]-4,4'-diamine (TPD), N,N'-di(naphthalene-1-yl)-N,N'-diphenyl benzidine ($\alpha$-NPD), and the like.

The EIL may be formed of a material such as LiF, NaCl, CsF, $Li_2O$, BaO, or Liq.

The ETL may be formed of $Alq_3$.

The organic emission layer may include a host material and a dopant material.

The host material of the organic emission layer may be $Alq_3$, 9,10-di(naphty-2-yl)anthracene (AND), 2-tert-butyl-9,10-bis-($\beta$-naphthyl)-anthracene (TBADN), 4,4'-Bis(2,2-diphenylvinyl)-1,1'-biphenyl (DPVBi), 4,4'-Bis[2,2-di(4-methylphenyl)-ethen-1-yl]biphenyl (p-DMDPVBi), Tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), Bis(9,9-diarylfluorene)s (BDAF), 4,4'-bis(2,2-diphenyl-ethene-1-yl)-4,4'-di-(tert-butyl)phenyl (p-TDPVBi), N,N'-dicarbazolyl-3,5-benzene (mCP), 1,3,5-Tris(carbazol-9-yl)benzene (tCP), 4,4',4"-Tris(carbazol-9-yl)triphenylamine (TcTa), 4,4'-N,N'-dicarbazole-biphenyl (CBP), 4,4'-bis(9-carbazolyl)-2,2'-dimethyl-biphenyl (CBDP), 4,4'-Bis(carbazol-9-yl)-9,9-dimethylfluorene (DMFL-CBP), 4,4'-bis(carbazole-9-yl)-9,9-bis(9-phenyl-9H-carbazole)fluorene (FL-4CBP), 4,4'-bis(carbazol-9-yl)-9,9-ditolylfluorene (DPFL-CBP), or 9,9-bis 9-phenyl-9H-carbazol)fluorene (FL-2CBP).

The dopant material of the organic emission layer may be 1,4'-bis[4-(di-p-tolylamino)styryl]biphenyl (DPAVBi), 9,10-di-(2-naphthyDanthracene (ADN), or 2-tert-butyl-9,10-di(naphth-2-yl)anthracene (TBADN).

In the present embodiment, the intermediate layer 414 includes the organic emission layer; however, the present invention is not limited thereto. That is, the intermediate layer 414 may include a liquid crystal layer, instead of the organic emission layer.

That is, the display apparatus 400 of the present embodiment is an organic light-emitting display apparatus as an example; however, the display apparatus 400 may be a liquid crystal display apparatus.

Meanwhile, the scan line S and the data line D are only described in the present embodiment; however, the present invention is not limited thereto. That is, the present embodiment may be applied to various conductive lines that are adjacent to the pixel electrode 110 and are arranged to cross each other.

An opposite electrode 415 is formed on the intermediate layer 414. The opposite electrode 415 may be formed of a metal material such as Ag, Mg, Al, Pt, Pd, Au, Ni, Nd, Ir, Cr, Li, or Ca.

Although not shown in FIG. 3, a sealing member (not shown) may be disposed on the opposite electrode 415. The sealing member is formed so as to prevent the pixel electrode 410, the intermediate layer 414, or the opposite electrode 415 from being damaged due to external impurities or shock, and may be formed of glass or a metal thin film, or may be formed as a stacked structure including an organic material and an inorganic material.

According to the display apparatus 400 of the present embodiment, reduction of the electrical characteristics of the second pixel electrode due to the by-products generated during the repairing process using the laser cutting, which is performed when a short circuit occurs at the overlapping portion between the data line and the scan line, may be effectively prevented. Therefore, defects of the pixel electrode may be prevented, and image quality of the display apparatus 400 may be improved.

According to the thin film transistor and the display apparatus of the present invention, the image quality characteristics may be improved.

Finally, as indicated above, certain defects in TFT substrates of the prior art are prevented by the present invention.

For example, since a curved portion of a first conductive line is formed so as to be separate from a second pixel electrode, an overlapping portion of the curved portion of the first conductive line is closer to the first pixel electrode than an extending line of a main body of the first conductive line is, and therefore a distance between the overlapping portion and the first pixel electrode and a distance between the overlapping portion and the second pixel electrode are nearly similar to each other, so that reduction in the electrical characteristics of the second pixel electrode due to by-products generated during a repairing process using laser-cutting is effectively prevented.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A thin film transistor substrate, comprising:
    a substrate;
    a plurality of first conductive lines formed on the substrate, each first conductive line comprising a main body extending in a direction and a curved portion connected to the main body;
    a plurality of second conductive lines disposed so as to cross the curved portions of the first conductive lines; and
    a plurality of pixel electrodes formed adjacent to the first conductive lines;
    wherein the plurality of pixel electrodes comprise a first pixel electrode disposed toward a side of one first conductive line among the plurality of first conductive lines, and a second pixel electrode disposed toward another side of the one first conductive line, a distance between the one first conductive line and the first pixel electrode being greater than a distance between the one first conductive line and the second pixel electrode, the curved portions of the first conductive lines comprising an overlapping portion overlapping with the second conductive line, and the overlapping portion being closer to the first pixel electrode than an extending line of the main body is.

2. The thin film transistor substrate of claim 1, wherein the first conductive lines are scan lines and the second conductive lines are data lines.

3. The thin film transistor substrate of claim 1, wherein curved portions of the first conductive line protrude toward the first pixel electrode.

4. The thin film transistor substrate of claim 1, wherein the curved portions of the first conductive line comprise a protrusion portion and connecting portions, wherein the protrusion portion comprises the overlapping portion and the connecting portions are connected to the main body.

5. The thin film transistor substrate of claim 4, wherein the protrusion portion is parallel to the main body, and the connecting portions are connected to opposite sides of the protrusion portion.

6. The thin film transistor substrate of claim 4, further comprising a separation region which is surrounded by the protrusion portion and the connecting portions, and which is separated from the main body.

7. The thin film transistor substrate of claim 6, wherein the separation region overlaps with the second conductive line.

8. The thin film transistor substrate of claim 1, wherein the pixel electrodes are formed at a same layer as the first conductive lines.

9. The thin film transistor substrate of claim 1, further comprising:
    an active layer formed on the substrate;
    a gate electrode formed at a same layer as the first conductive lines; and
    a source electrode and a drain electrode formed at a same layer as the second conductive lines;
    one of the source electrode and the drain electrode being electrically connected to the pixel electrodes.

10. The thin film transistor substrate of claim 9, wherein the gate electrode comprises a first conductive layer and a second conductive layer formed on the first conductive layer, and the pixel electrodes are formed of a same material as the first conductive layer and on a same layer as the first conductive layer.

11. The thin film transistor substrate of claim 1, wherein the pixel electrodes comprise one of ITO, IZO, ZnO, $In_2O_2$, IGO, and AZO.

12. A display apparatus, comprising:
    a substrate;
    a plurality of first conductive lines formed on the substrate, each first conductive line comprising a main body extending in a direction and a curved portion connected to the main body;
    a plurality of second conductive lines arranged so as to cross the curved portions of the first conductive lines;
    a plurality of pixel electrodes formed adjacent to the first conductive lines;
    an intermediate layer electrically connected to the pixel electrodes for displaying images; and
    an opposite electrode formed on the intermediate layer;
    wherein the plurality of pixel electrodes comprise a first pixel electrode disposed toward a side of one first conductive line among the plurality of first conductive lines, and a second pixel electrode disposed toward another side of the one first conductive line, a distance between the one first conductive line and the first pixel electrode being greater than a distance between the one first conductive line and the second pixel electrode, the curved portion comprising an overlapping portion overlapping with the second conductive line, and the overlapping portion being closer to the first pixel electrode than an extending line of the main body is.

13. The display apparatus of claim 12, wherein the first conductive lines are scan lines and the second conductive lines are data lines.

14. The display apparatus of claim 12, wherein the curved portions of the first conductive line protrude toward the first pixel electrode.

15. The display apparatus of claim 12, wherein the curved portions of the first conductive line comprise a protrusion portion and connecting portions, wherein the protrusion portion comprises the overlapping portion and the connecting portions are connected to the main body.

16. The display apparatus of claim 15, wherein the protrusion portion is parallel to the main body, and the connecting portions are connected to opposite sides of the protrusion portion.

17. The display apparatus of claim 15, further comprising a separation region which is surrounded by the protrusion portion and the connecting portions, and which is separated from the main body.

18. The display apparatus of claim 17, wherein the separation region overlaps with the second conductive line.

19. The display apparatus of claim 12, wherein the pixel electrodes are formed at a same layer as the first conductive lines.

20. The display apparatus of claim 12, further comprising:
    an active layer formed on the substrate;
    a gate electrode formed at a same layer as the first conductive lines; and
    a source electrode and a drain electrode formed at a same layer as the second conductive lines;
    one of the source electrode and the drain electrode being electrically connected to the pixel electrodes.

21. The display apparatus of claim 20, wherein the gate electrode comprises a first conductive layer and a second conductive layer formed on the first conductive layer, and the pixel electrodes are formed of a same material as the first conductive layer and on a same layer as the first conductive layer.

22. The display apparatus of claim 12, wherein the intermediate layer comprises one of an organic emission layer and a liquid crystal layer.

23. The display apparatus of claim 12, wherein the pixel electrode comprises one of ITO, IZO, ZnO, $In_2O_2$ IGO, and AZO.

24. A method of manufacturing a thin film transistor substrate, comprising:
    providing a substrate;
    forming a plurality of first conductive lines on the substrate, each first conductive line comprising a main body extending in a direction and a curved portion connected to the main body;
    disposing a plurality of second conductive lines so as to cross the curved portions of the first conductive lines; and
    forming a plurality of pixel electrodes adjacent to the first conductive lines;
    wherein the plurality of pixel electrodes comprise a first pixel electrode disposed toward a side of one first conductive line among the plurality of first conductive lines, and a second pixel electrode disposed toward another side of the one first conductive line, a distance between the one first conductive line and the first pixel electrode being greater than a distance between the one first conductive line and the second pixel electrode, the curved portions of the first conductive lines comprising an overlapping portion overlapping with the second conductive line, and the overlapping portion being closer to the first pixel electrode than an extending line of the main body is.

25. The method of claim 24, wherein the first conductive lines are scan lines and the second conductive lines are data lines.

26. The method of claim 24, wherein the curved portions of the first conductive line comprise a protrusion portion and connecting portions, wherein the protrusion portion comprises the overlapping portion and the connecting portions are connected to the main body.

27. The method of claim 26, wherein the protrusion portion is parallel to the main body, the method further comprising the step of connecting the connecting portions to opposite sides of the protrusion portion.

28. The method of claim 26, further comprising the step of providing a separation region which is surrounded by the protrusion portion and the connecting portions, and which is separated from the main body.

29. The method of claim 28, further comprising the step of overlapping the separation region with the second conductive lines.

30. The method of claim 24, further comprising the step of forming the pixel electrodes at a same layer as the first conductive lines.

31. The method of claim 24, further comprising the steps of:
    forming an active layer on the substrate;
    forming a gate electrode at a same layer as the first conductive lines;
    forming a source electrode and a drain electrode at a same layer as the second conductive lines; and
    electrically connecting one of the source electrode and the drain electrode to the pixel electrodes.

32. The method of claim 31, wherein the gate electrode comprises a first conductive layer and a second conductive layer formed on the first conductive layer, and further comprising the step of forming the pixel electrodes of a same material as the first conductive layer and on a same layer as the first conductive layer.

33. A method of manufacturing a display apparatus, comprising:
    providing a substrate;
    forming a plurality of first conductive lines on the substrate, each first conductive line comprising a main body extending in a direction and a curved portion connected to the main body;
    disposing a plurality of second conductive lines so as to cross the curved portions of the first conductive lines;
    forming a plurality of pixel electrodes adjacent to the first conductive lines;
    connecting an intermediate layer electrically to the pixel electrodes for displaying images; and
    forming an opposite electrode on the intermediate layer;
    wherein the plurality of pixel electrodes comprise a first pixel electrode disposed toward a side of one first conductive line among the plurality of first conductive lines, and a second pixel electrode disposed toward another side of the one first conductive line, a distance between the one first conductive line and the first pixel electrode being greater than a distance between the one first conductive line and the second pixel electrode, the curved portion comprising an overlapping portion overlapping with the second conductive line, and the overlapping portion being closer to the first pixel electrode than an extending line of the main body is.

34. The method of claim 33, wherein the first conductive lines are scan lines and the second conductive lines are data lines.

35. The method of claim 33, wherein the curved portions of the first conductive line comprise a protrusion portion and connecting portions, wherein the protrusion portion comprises the overlapping portion and the connecting portions are connected to the main body.

36. The method of claim 35, wherein the protrusion portion is parallel to the main body, and the method further comprising connecting the connecting portions to opposite sides of the protrusion portion.

37. The method of claim 35, further comprising the step of providing a separation region which is surrounded by the protrusion portion and the connecting portions, and which is separated from the main body.

38. The method of claim 37, further comprising the step of overlapping the separation region with the second conductive line.

39. The method of claim 33, further comprising the step of forming the pixel electrodes at a same layer as the first conductive lines.

40. The method of claim 33, further comprising the steps of:
- forming an active layer on the substrate;
- forming a gate electrode at a same layer as the first conductive lines;
- forming a source electrode and a drain electrode at a same layer as the second conductive lines; and
- electrically connecting one of the source electrode and the drain electrode to the pixel electrodes.

41. The method of claim 40, wherein the gate electrode comprises a first conductive layer and a second conductive layer formed on the first conductive layer, and further comprising the step of forming the pixel electrodes of a same material as the first conductive layer and on a same layer as the first conductive layer.

* * * * *